(12) United States Patent
Jacob et al.

(10) Patent No.: US 6,707,699 B1
(45) Date of Patent: Mar. 16, 2004

(54) HISTORICAL INFORMATION STORAGE FOR INTEGRATED CIRCUITS

(75) Inventors: Michael Klaus Jacob, Kanagawa (JP); Joerg Wilfried Wohlfahrt, Kanagawa (JP); Norbert Rehm, Kanagawa (JP); Hans-Oliver Joachim, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,167

(22) Filed: Sep. 24, 2002

(51) Int. Cl.$^7$ ............................................... G11C 11/22
(52) U.S. Cl. ...................................... 365/145; 365/236
(58) Field of Search ................... 365/145, 236

(56) References Cited

U.S. PATENT DOCUMENTS 5,872,738 A * 2/1999 Yamashiroya ............... 365/200
5,892,715 A * 4/1999 Hirata et al. ........... 365/185.29

* cited by examiner

*Primary Examiner*—Van Thu Nguyen
(74) *Attorney, Agent, or Firm*—Horizon IP Pte Ltd

(57) ABSTRACT

The present invention describes an information recorder which is integrated into an IC, such as ferroelectric RAM device. The recorder counts desired events, such as memory accesses or length of time powered up and stores such information in a latch. The information can be retrieved from the latch to assist in failure analysis and device characterization.

19 Claims, 3 Drawing Sheets

HISTORICAL INFORMATION STORAGE FOR INTEGRATED CIRCUITS

BACKGROUND OF THE INVENTION

Non-volatile memory ICs, such as ferroelectric or magnetic memories, have only been recently available on the market or still under development. Aging of such ICs depends strongly on their history, such as usage and environmental conditions. It is important for developers to have detailed and accurate information to correctly characterize the ICs. Additionally, historical information from customer or end user returns are important to develop long term reliability data used to understand and improve IC design.

Conventionally, historical information can only be collected manually by customers or end users. However, manual collection of information can be prone to mistakes. Furthermore, certain information, such as which cell or device is accessed, may not be amenable to manual tracking.

From the foregoing discussion, it is desirable to provide an easy and accurate way of collecting historical information.

SUMMARY OF INVENTION

The present invention pertains to implementation of an information recorder in an IC. In one embodiment, the IC comprises a non-volatile memory IC, such as ferroelectric or magnetic memories. In one embodiment, the information recorder comprises a counter circuit coupled to a latch. The counter receives an event signal. Each time the event signal is received, the counter increments the count. The count value is stored in the latch. The event signal represents an occurrence of an event which is to be tracked. For example, the event could a memory access, length of time powered up, temperature, or pressure experienced by the IC. The count value can be retrieved from the latch to assist in failure analysis and device characterization.

DETAILED DESCRIPTION

The invention relates to recording historical information in an integrated circuit (IC). In one embodiment, an information recording circuit is integrated into the IC for recording historical information. The IC, for example, is a non-volatile memory IC, such as a ferroelectric or magnetic random access memory. Other types of ICs which historical information is desired are also useful.

Figure 1:
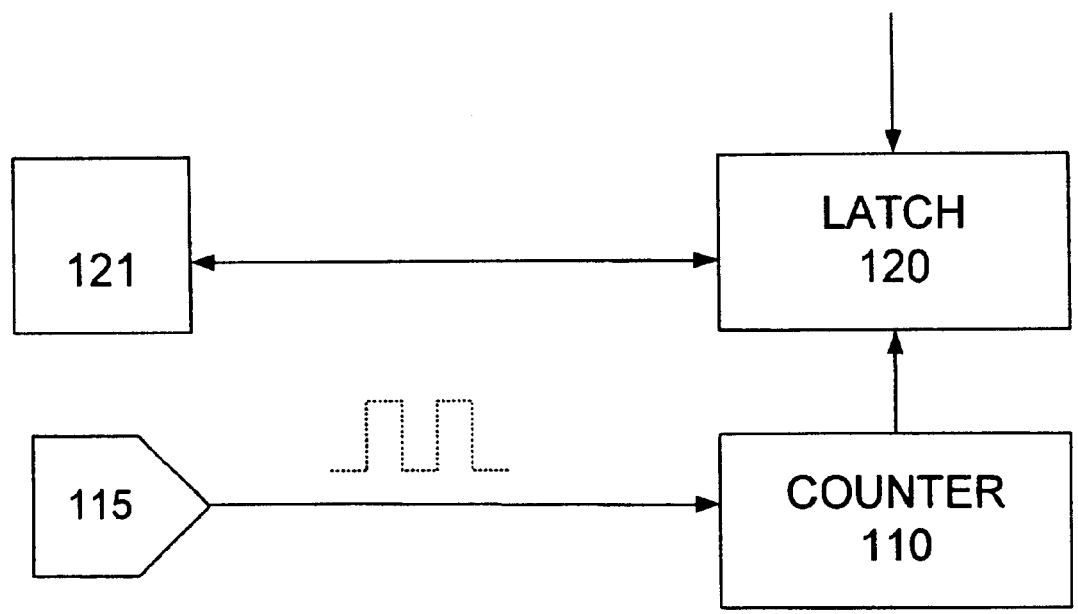
FIGS. 1–3 show information collection circuits in accordance with various embodiments of the invention.
Figure 2:
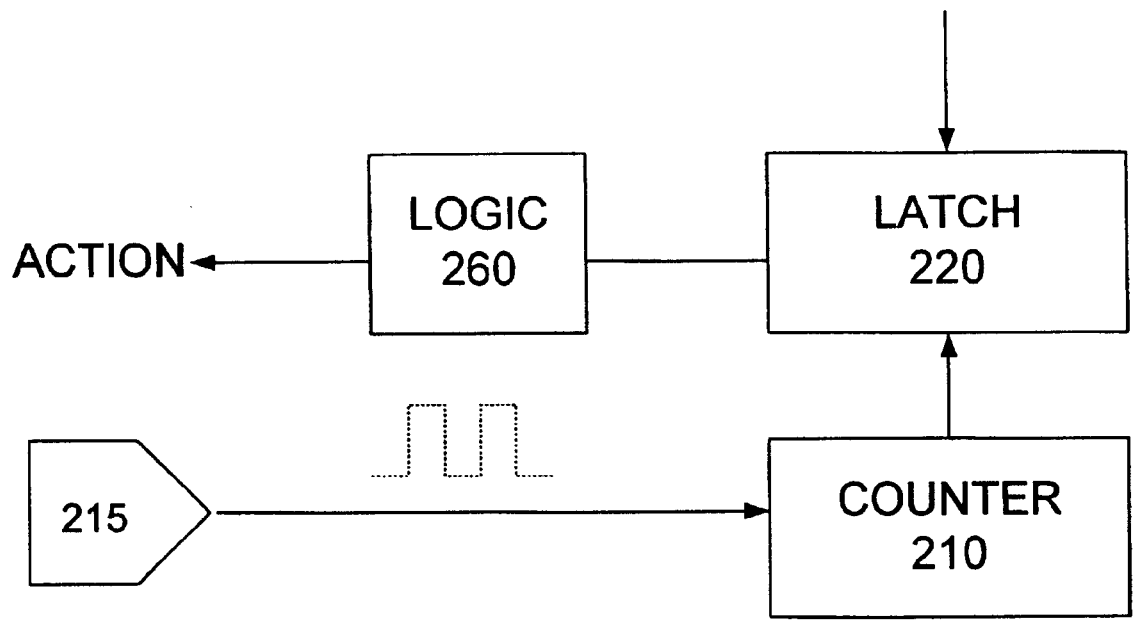
Figure 3:
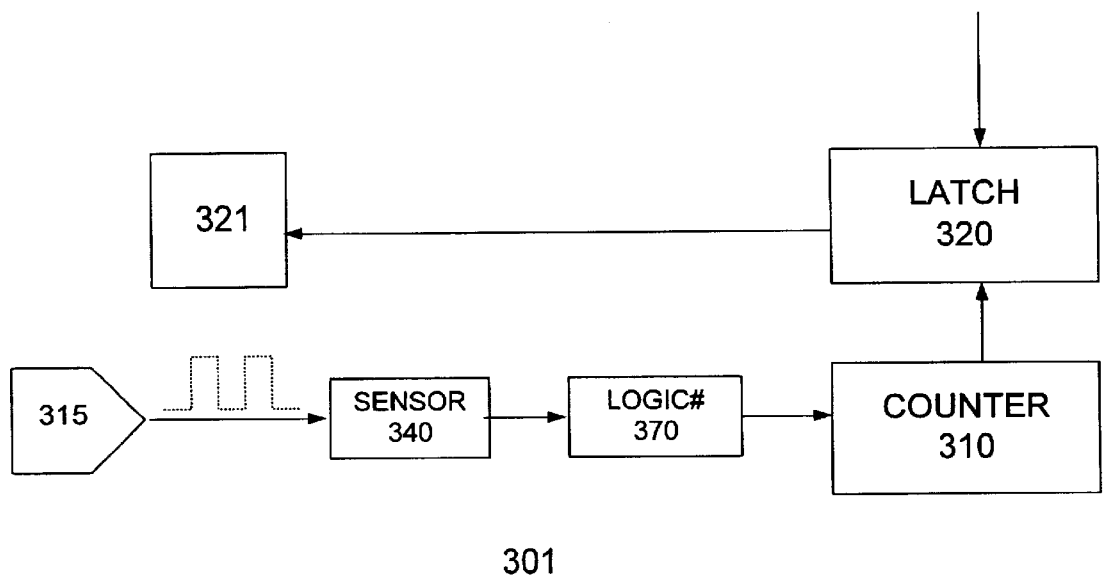

FIGS. 1–3 show different information recording circuits in accordance with various embodiments of the invention. Referring to FIG. 1, a recording circuit 101 comprises a counter 110 and a storage latch 120. The counter receives a signal 115 which corresponds to a desired event which is to be recorded. The signal can be an external or internal signal corresponding to the desired event. An event which can be recorded includes, for example, power up's (or power down's), accesses to the IC, accesses to specific addresses of the IC (e.g., cell, block, wordline, bitline or plateline) or write or read accesses. Other types of events corresponding to external or internal signals can also be recorded by the information recording circuit.

Upon occurrence of the desired event, the counter circuit receives a signal corresponding to the event and increments the value of the count. Various types of conventional counter circuits can be used. The counter stores the count value in the storage latch. In one embodiment, the storage latch comprises non-volatile storage elements. The use of a non-volatile storage latch advantageously retains the information, even after power is removed. After power is restored, the counter can be set with the value stored in the latch to maintain the count value prior to power down. For non-volatile memory ICs, the non-volatile elements can be fabricated from the same materials as that of the non-volatile memory cells of the IC. In one embodiment, the storage latch comprises ferroelectric memory cells. This advantageously enables the information recording circuit to be formed without additional processing steps.

The information can be retrieved from the latch by setting or programming the IC to operate in test mode. This can be achieved with, for example, the use of automatic test equipment (ATE) such as ADVANTEST or TACT. A sequence of pulses can be applied to the control and/or address pins, setting the IC in test mode. In test mode, the information stored in the latch is output to an external pin. For example, each bit of the latch can be shifted to pin 121 serially. The information can also be read out through multiple pins of the IC in parallel or a combination of both parallel and serial techniques. In applications employing a volatile latch, the information from the latch can be retrieved and stored prior to each power down.

In another embodiment, the counter can receive multiple signals for recording multiple events, storing the cumulative occurrences of all such events in the latch. Alternatively, multiple recording circuits are provided to count the different events.

The recording circuit can also be used to record the duration of time that the IC has been powered up. This can be achieved by counting the number of clock cycles from a clock circuit, either internal or external to the IC. The counter, for example, counts the number of cycles or a group of cycles which represent a unit of time. Other types of internal and external signals can also be counted. Each time a specified number of clock cycles is reached, the counter circuit is incremented by 1 and the information is stored in the latch.

FIG. 2 shows another embodiment of the information recording circuit 201. Like the circuit described in FIG. 1, the information recording circuit 201 includes a counter 210 which receives an event signal which is to be counted and stored in a storage latch 220. A control circuit 260 is coupled to the storage latch. The control circuit retrieves the value stored in the storage latch and compares it with a predefined value stored in the control circuit or memory. In one embodiment, the control circuit performs the comparison after each time the latch is changed or written to or when the counter is incremented. If the value retrieved matches the predefined value, the control circuit initiates an internal action by the IC.

In one embodiment, the recording circuit records the number of accesses to a ferroelectric memory IC. After reaching a predetermined number of accesses, the control circuit initiates a healing or data refresh process. Such process, for example, includes cycling the memory cells with a high voltage after imprint of fatigue. Alternatively, the counter counts only specific accesses to a block to refresh only specific blocks when a predefined number of accesses has been reached. Other schemes for refreshing or healing can also be implemented by sensing different event signals.

FIG. 3 shows an information recording circuit 301 in accordance with yet another embodiment of the invention.

The information recording circuit 301 is useful for recording a change in an environmental condition, such as temperature or mechanical stress. As shown, the information recording circuit includes a sensor 340 for sensing the change in the desired environmental condition. For example, the sensor comprises a temperature sensor for sensing changes in temperature. Other types of sensors, such as mechanical stress or pressure sensors, can also be employed. Generally, the sensor generates an analog voltage signal which corresponds to, for example, a given temperature, pressure or other conditions that are to be measured. Control logic canbe used to compare the signal with a defined value or values. Based on the result of the comparison, the logic can increase the counter or trigger a desired action.

A control logic 370 is coupled to the sensor. The control logic receives the analog voltage values from the sensors and converts it into a digital value (current value) representing the current environmental condition once every defined cycle. The control logic can also include comparison circuitry which receives the current value and compares it with a preset value. If the current value is not equal to the preset value or exceeds the preset value by a predefined amount, than a change in the environmental condition has occurred. The preset value can be a predefined value or the current value of the last cycle that a change in environmental condition occurred. The control circuit then causes a counter 310 coupled thereto to be incremented. The value in the counter is then stored in a non-volatile latch 320. The value stored in the latch can be retrieved through one or more pins of the IC, as previously described.

As described, the present invention provides historical information of an IC which previously was not available or not easily obtained. Such information assists designers tremendously in the area of failure analysis and device characterization, as well as improving reliability in future designs.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit (IC) comprising:
   a recording circuit including;
   a counter for receiving an event signal representing an occurrence of an event;
   sensor and sensor control logic for sensing the event selected from the group comprising temperature and pressure; and
   a latch coupled to the counter, the counter counts the event signal and stores the count value in the latch.

2. The IC of claim 1 comprises a non-volatile memory IC.

3. The IC of claim 2 wherein the latch comprises non-volatile storage elements which are the same as non-volatile storage elements of the non-volatile memory IC.

4. The IC of any of claims 1–3 comprises a control logic for initiating an action after the count value exceeds a specified value.

5. The IC of any of claims 1–3 comprises a test operating mode in which the count value can be retrieved from the latch.

6. The IC of any of claims 1–3 comprises a wherein the counter counts a plurality of different events.

7. The IC of claim 6 comprises control logic for initiating an action after the count value exceeds a specified value.

8. An integrated circuit (IC) comprising:
   a recording circuit including;
   a counter for receiving a plurality of event signals corresponding to a plurality of different events; and
   a latch coupled to the counter, the counter counts the plurality of different event signals and stores the count value in the latch.

9. The IC of claim 8 comprises a non-volatile memory IC.

10. The IC of claim 9 wherein the latch comprises non-volatile storage elements which are the same as non-volatile storage elements of the non-volatile memory IC.

11. The IC of any of claims 8–10 wherein the events are selected from the group of events comprising a memory access, a type of memory access, temperature, and pressure.

12. The IC of claim 11 further comprises a sensor and a sensor control logic for sensing an event selected from the group comprising of temperature and pressure.

13. The IC of claim 11 further comprises a control logic for initiating an action after the count value exceeds a specified value.

14. The IC of claim 11 comprising a test operating mode in which the count value can be retrieved from the latch.

15. The IC of any of claims 8–10 further comprises a plurality of recording circuits for counting different event signals.

16. The IC of claim 15 wherein the events are selected from the group of events comprising a memory access, a type of memory access, temperature, and pressure.

17. The IC of claim 16 further comprises a sensor and a sensor control logic for sensing an event selected from the group comprising of temperature and pressure.

18. The IC of claim 16 further comprises a control logic for initiating an action after the count value exceeds a specified value.

19. The IC of claim 16 comprising a test operating mode in which the count value can be retrieved from the latch.

* * * * *